(12) United States Patent
Park et al.

(10) Patent No.: US 8,921,935 B2
(45) Date of Patent: Dec. 30, 2014

(54) SEMICONDUCTOR DEVICE

(75) Inventors: Kangwook Park, Seoul (KR); Donghyun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 76 days.

(21) Appl. No.: 13/311,780

(22) Filed: Dec. 6, 2011

(65) Prior Publication Data

US 2012/0175703 A1 Jul. 12, 2012

(30) Foreign Application Priority Data

Jan. 12, 2011 (KR) .................. 10-2011-0003222

(51) Int. Cl.
| | |
|---|---|
| *H01L 29/66* | (2006.01) |
| *H01L 29/78* | (2006.01) |
| *H01L 29/49* | (2006.01) |
| *H01L 29/06* | (2006.01) |
| *H01L 29/08* | (2006.01) |
| *H01L 29/10* | (2006.01) |
| *H01L 29/165* | (2006.01) |
| *H01L 29/51* | (2006.01) |

(52) U.S. Cl.
CPC ........ *H01L 29/7835* (2013.01); *H01L 29/4983* (2013.01); *H01L 29/66659* (2013.01); *H01L 29/0653* (2013.01); *H01L 29/0847* (2013.01); *H01L 29/1054* (2013.01); *H01L 29/165* (2013.01); *H01L 29/4958* (2013.01); *H01L 29/4966* (2013.01); *H01L 29/4975* (2013.01); *H01L 29/517* (2013.01); *H01L 29/518* (2013.01)
USPC .......................................................... 257/336

(58) Field of Classification Search
CPC .................................................. H01L 29/7835
USPC ......................................................... 257/336
See application file for complete search history.

(56) References Cited

U.S. PATENT DOCUMENTS

| | | | |
|---|---|---|---|
| 6,239,463 B1 | 5/2001 | Williams et al. | |
| 2003/0127694 A1 | 7/2003 | Morton et al. | |
| 2004/0132271 A1* | 7/2004 | Ang et al. | 438/585 |
| 2006/0252238 A1* | 11/2006 | Li | 438/520 |
| 2007/0267693 A1 | 11/2007 | Chien et al. | |
| 2009/0258484 A1* | 10/2009 | Peidous et al. | 438/592 |
| 2010/0164011 A1* | 7/2010 | Frank et al. | 257/369 |
| 2011/0147837 A1* | 6/2011 | Hafez et al. | 257/338 |

FOREIGN PATENT DOCUMENTS

JP 2009-277776 11/2009

* cited by examiner

*Primary Examiner* — Matthew Reames
(74) *Attorney, Agent, or Firm* — F. Chau & Associates, LLC

(57) ABSTRACT

A source region and a drain region are disposed in a substrate. A gate insulating film is disposed on the substrate. A gate electrode is disposed on the gate insulating film. The gate electrode may include a first gate portion adjacent to the source region and a second gate portion adjacent to the drain region. The first and second gate portions have different work functions from each other.

21 Claims, 8 Drawing Sheets

SEMICONDUCTOR DEVICE

CROSS-REFERENCE TO RELATED APPLICATIONS

This U.S. non-provisional patent application claims priority under 35 U.S.C. §119 to Korean Patent Application No. 10-2011-0003222, filed on Jan. 12, 2011, the entire contents of which are hereby incorporated by reference.

BACKGROUND

The inventive concept disclosed herein relates to semiconductor devices, and more particularly, to a semiconductor device including a high voltage transistor.

Semiconductor devices may be classified into memory devices and logic devices. The memory devices may store data and the logic devices may perform a function of operating data or a function of executing a predetermined command.

Semiconductor devices are an important factor in the electronics industry due to their miniaturization, multifunctionality and high speed characteristics. Thus, as the electronics industry develops, there is an ever-increasing demand for higher integration, increased functionality, higher speeds, and better reproducibility and reliability of semiconductor devices. However, these enhanced requirements may be in a tradeoff relation such that improvements in one characteristic must be balanced with reduction in another desirable characteristic. As a result, it is increasingly difficult to satisfy all of the requirements described above at the same time. For instance, as line widths of semiconductor patterns and/or a space between semiconductor patterns are reduced, it is difficult to increase an operation speed of the semiconductor devices. Also, as line widths of semiconductor patterns and/or a space between semiconductor patterns are reduced, it is difficult to retain high reliability and/or reproducibility. The electronics industry is highly competitive and improved characteristics of new semiconductors are continuously being sought.

SUMMARY

The present inventive concept provides a semiconductor device. The semiconductor device includes a source region and a drain region in a substrate; a gate insulating film disposed on the substrate; and a gate electrode disposed on the gate insulating film. The gate electrode comprises a first gate portion adjacent to the source region and a second gate portion adjacent to the drain region. The first and second gate portions have different work functions from each other. The first and second gate portions may each comprise a metal and may be in direct contact with each other.

BRIEF DESCRIPTION OF THE FIGURES

The foregoing and other features and advantages of the invention will be apparent from the more particular description of preferred embodiments of the invention, as illustrated in the accompanying drawings in which like reference characters refer to the same parts in the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

It will be understood that when an element such as a layer, region or substrate is referred to as being "on" or "onto" another element, it may lie directly on the other element or intervening elements or layers may also be present. It will be understood that, although the terms first, second, etc. may be used herein to describe various elements, these elements should not be limited by these terms. These terms are only used to distinguish one element from another.

Figure 1:
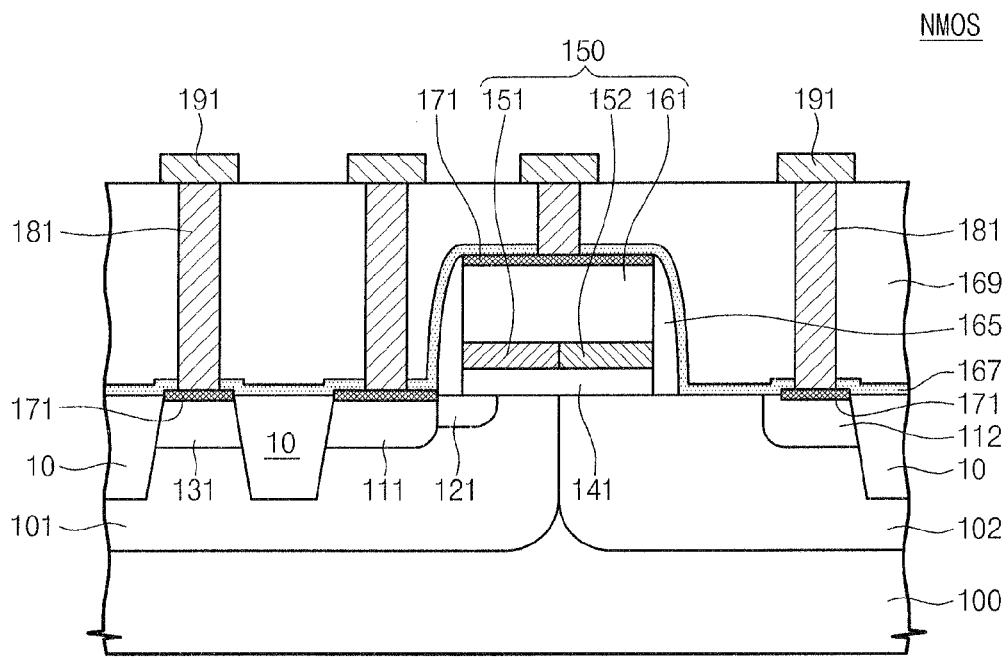
FIGS. 1 and 2 are cross sectional views of a semiconductor device in accordance with a first embodiment of the inventive concept.
Figure 2:
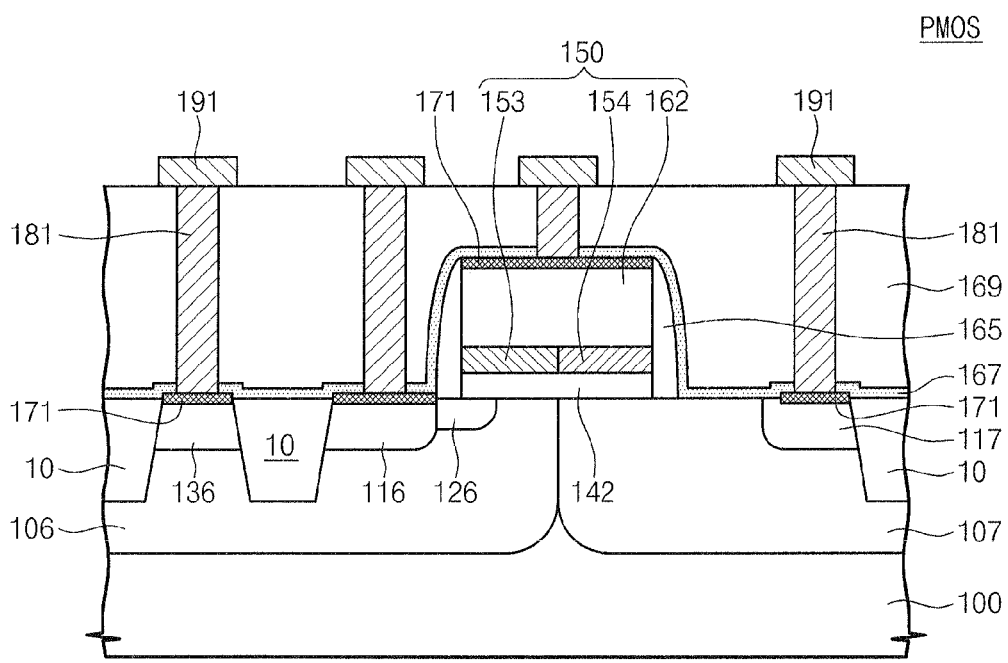

FIGS. 1 and 2 are cross sectional views of a semiconductor device in accordance with a first embodiment of the inventive concept. FIG. 1 may be an NMOS transistor and FIG. 2 may be a PMOS transistor. More specifically, FIGS. 1 and 2 may be high voltage transistors of semiconductor device. The high voltage transistor may be formed together with a general transistor (not shown).

An NMOS transistor in accordance with the first embodiment of the inventive concept may be provided as shown in FIG. 1. A plurality of impurity regions may be disposed in a substrate 100. The substrate 100 may include a semiconductor-based structure having a silicon surface. The semiconductor-based structure may include a silicon, a silicon epitaxial layer supported by a semiconductor structure, or silicon on an insulator. As an illustration, the substrate 100 may be a silicon substrate doped with a p-type impurity. A device isolation pattern 10 may be disposed in the substrate 100. The device isolation pattern 10 may be a trench type device isolation pattern. As an illustration and without limitation, the device isolation pattern 10 may include a silicon film or a silicon oxynitride film disposed on the surface of the substrate or in a trench formed in the substrate.

A source region 111 and a drain region 112 may be disposed in the substrate 100. The source region 111 and the drain region 112 may be disposed adjacent to the device isolation pattern 10. The source region 111 and the drain region 112 may be strongly doped with an n-type impurity. A first extension region 121 may extend towards the drain region 112 from the source region 111. The first extension region 121 may be weakly doped with an n-type impurity. As an illustration, the first extension region 121 may be doped at a concentration corresponding to 5%~30% of the doping concentration of the source region 111 and the drain region 112.

A first well region 101 may be disposed in the substrate 100. The source region 111 may be disposed in the first well region 101. The first well region 101 may be disposed adjacent to the source region 111 and may not be in direct contact with the drain region 112. The first well region 101 may have a different conductivity type from the source region 111 and the drain region 112. As an illustration, the first well region 101 may be a region weakly doped with a p-type impurity.

A well contact region 131 may be disposed in the first well region 101. The well contact region 131 may be strongly doped with an impurity of the same conductivity type as the first well region 101. The well contact region 131 may be doped with an impurity so as to be suitable for applying a voltage to the first well region 101. The well contact region 131 may be separated from the source region 111 by the device isolation pattern 10.

A drift region 102 may be disposed to be adjacent to the drain region 112. The drift region 102 may be disposed between the first well region 101 and the drain region 112. The conductivity type of the drift region 102 may be of the same type as the source and drain regions 111 and 112. A doping concentration of the drift region 102 may be lower than that of the first extension region 121. The drift region 102 may relieve the hot carrier effect that may occur when a high voltage is applied to the drain region 112. That is, the drift region 102 is a region having a relatively low doping concentration and may lower the electric field between the source region 111 and the drain region 112 to relieve the hot carrier effect due to carriers moving from the source region 111 to the drain region 112. Thus, durability of semiconductor device may be improved.

A gate insulating film 141 may be disposed on the substrate 100. The gate insulating film 141 may include a high-k dielectric film having a dielectric constant higher than a silicon oxide film. As an illustration, the gate insulating film 141 may include one or more of a metal oxide film such as an aluminum oxide film, a hafnium oxide film, and a metal-semiconductor-oxygen compound film such as, for instance, a hafnium-silicon-oxygen-nitrogen compound film. The gate insulating film 141 may include a plurality of layers. As an illustration, the gate insulating film 141 may be provided in a form such that the hafnium oxide film and the aluminum oxide film are stacked. When the gate insulating film 141 includes a high-k dielectric film, the leakage current may be relieved in a high voltage transistor to which a high voltage is applied.

A gate electrode structure 150 may be disposed on the gate insulating film 141. The gate electrode structure 150 may include a first gate portion 151 and a second gate portion 152. A work function of the first gate portion 151 may be different from that of the second gate portion 152. The work function of the first gate portion 151 may be lower than the work function of the second gate portion 152. When the first and second gate portions 151 and 152 include a metal material, formation of a depletion region at a lower portion of a gate electrode adjoining the gate insulating film 141 may be prevented. As an illustration, the first and second gate portions 151 and 152 may each include one or more of TiN, TaC, TaN, TaSiN, NiSi, Pt and TaCN. The work functions of the first and second gate portions 151 and 152 may be controlled by various methods. As an illustration, the second gate portion 152 may further include aluminum (Al). A part of the first gate portion 151 may further include lanthanum (La). In another illustrative example of the first embodiment of the inventive concept, the work functions of the first and second gate portions 151 and 152 may be changed depending on the deposition temperature during their formation. This will be described in detail below according to certain embodiments of the manufacturing process. In another illustrative example of the first embodiment, the first gate portion 151 may include a conductive metal nitride, and may further include at least one of Tb, Er, Yb and Sc. The second gate portion 152 may include a conductive metal nitride, and may further include at least one of Pt, Ni or Ir. In an illustrative example of the first embodiment, wherein the first and second gate portions 151 and 152 include a semiconductor material, work functions of the first and second gate portions 151 and 152 may be controlled by a doping of impurity elements of group III or group V. In one illustrative example of the first embodiment, the first gate portion 151 is in direct contact with the second gate portion 152.

When viewed from a top plan view, the first gate portion 151 may overlap the first well region 101. The first gate portion 151 having a relatively low work function may lower the threshold voltage Vt of an NMOS transistor. That is, in an upper portion of the first well region 101 connected to the first gate portion 151 through the gate insulating film 141, an energy band thereof may be bent down by the low work function of the first gate portion 151. Thus, an inversion region may be formed at a relatively low voltage.

When viewed from a top plan view, the second gate portion 152 may overlap the drift region 102. The second gate portion 152 having a relatively high work function may relieve any hot carrier effect. That is, a surface Fermi level of the drift region 102 moves toward a valance band and thereby the distance between the Fermi level and the valance band may be reduced. Thus preventing hot carrier trapped in the gate insulating film 141 at a high voltage, and preventing damage the gate insulating film 141. Thus, hot carrier effects of the semiconductor device may be reduced.

An interface between the first and second gate portions 151 and 152 may or may not coincide with an interface between the first well region 101 and the drift region 102. The interface between the first and second gate portions 151 and 152 may be adjusted by design as necessary. Also, the interface between the first well region 101 and the drift region 102 may be adjusted by design as necessary. As an illustration, a distance from the source region 111 to the interface between the first well region 101 and the drift region 102 may be twice or less the distance from the drain region 112 to the interface.

A third gate portion 161 may be disposed on the first and second gate portions 151 and 152. When the first and second gate portions 151 and 152 include a metal, the third gate portion 161 may include a semiconductor material. As an illustration, the third gate portion 161 may include poly silicon. In one illustrative example, the thickness of the third gate portion 161 is greater than thicknesses of the first and second gate portions 151 and 152.

A spacer 165 may be disposed on a sidewall of the gate electrode structure 150. The spacer 165 may include at least one of a silicon oxide film, a silicon oxynitride film or a silicon nitride film. An interlayer insulating film 169 may be disposed to cover the gate electrode structure 150. The interlayer insulating film 169 may include a silicon oxide film or a silicon oxynitride film. An etch-stop film 167 may be disposed between the interlayer insulating film 169 and the substrate 100. The etch-stop film 167 may include a silicon nitride film.

The source and drain regions 111 and 112, the well contact region 131 and the gate electrode structure 150 may be connected to conductive lines 191 through contact plugs 181 penetrating the interlayer insulating film 169. As an illustration, the conductive lines 191 and the contact plugs 181 may include metal or conductive metal nitride. A silicide layer 171 may be disposed on the source and drain regions 111 and 112, the well contact region 131 and the gate electrode structure 150. The silicide layer 171 may provide an ohmic contact between the contact plugs 181 and a semiconductor layer under the contact plug 181.

Referring to FIG. 2, a PMOS transistor in accordance with an illustrative example of the first embodiment of the inventive concept is provided. For brevity of description, the description of the same structures as described above will be omitted.

A plurality of impurity regions may be disposed in a substrate 100. As an illustration, the substrate 100 may be a silicon substrate doped with a p-type impurity. A source region 116 and a drain region 117 may be disposed in the substrate 100. The source region 116 and the drain region 117 may be regions strongly doped with a p-type impurity. A first extension region 126 extending from the source region 116 to the drain region 117 may be provided. The first extension region 126 may be a region weakly doped with a p-type impurity.

A first well region 106 may be disposed in the substrate 100. The source region 116 may be disposed in the first well region 106. The first well region 106 may be disposed to be adjacent to the source region 116 and not in direct contact with the drain region 117. The first well region 106 may have a different conductivity type from the source and drain regions 116 and 117. As an illustration, the first well region 106 may be a region weakly doped with an n-type impurity. A well contact region 136 may be disposed in the first well region 106. The well contact region 136 may be a region strongly doped with an impurity of the same conductivity type as that of the first well region 106.

A drift region 107 may be disposed to be adjacent to the drain region 117. The drift region 107 may be disposed between the first well region 106 and the drain region 117. A conductivity type of the drift region 107 may be the same with those of the source and drain regions 116 and 117. In one illustrative example, the doping concentration of the drift region 107 is lower than that of the first extension region 126.

A gate insulating film 142 may be disposed on the substrate 100. The gate insulating film 142 may include a high-k dielectric film having a dielectric constant higher than that of a silicon oxide film. As an illustration, the gate insulating film 142 may include at least one of a metal oxide film like a hafnium oxide film, or an aluminum oxide film, and a metal-semiconductor-oxygen compound film such as a hafnium-silicon-oxygen-nitrogen compound film. The gate insulating film 142 may include a plurality of layers. As an illustration, the gate insulating film 142 may be provided in a form such that the hafnium oxide film and the aluminum oxide film are stacked.

A gate electrode structure 150 may be disposed on the gate insulating film 142. The gate electrode structure 150 may include a first gate portion 153 and a second gate portion 154. The work function of the first gate portion 153 may be different from the work function of the second gate portion 154. The work function of the first gate portion 153 may be higher than the work function of the second gate portion 154.

When viewed from a top plan view, the first gate portion 153 may overlap the first well region 106. The first gate portion 153 having a relatively high work function may lower the threshold voltage Vt of a PMOS transistor. When viewed from a top plan view, the second gate portion 154 may overlap the drift region 107. The second gate portion 154 having a relatively low work function may relieve any hot carrier effect. That is, a surface Fermi level of the drift region 107 relatively moves toward a valance band and thereby the distance between the Fermi level and the valance band may be reduced. Thus preventing trapping of hot carrier formed at high voltage in the gate insulating film 142 and preventing damage the gate insulating film 142. Therefore, hot carrier effects of the semiconductor device may be reduced.

Figure 3:
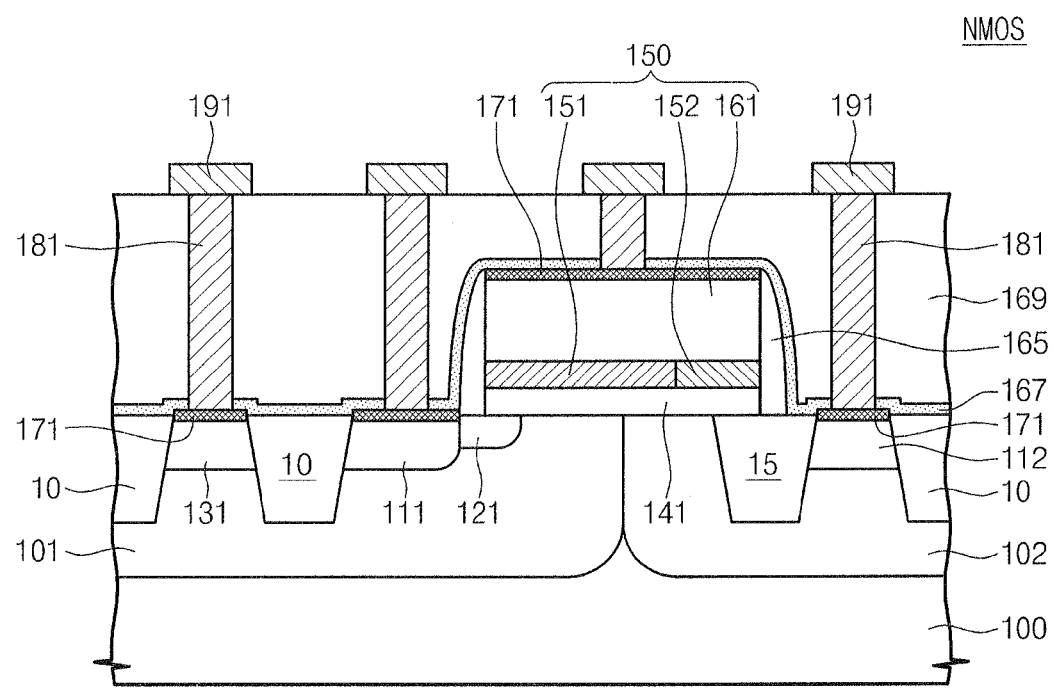
FIGS. 3 through 5 are cross sectional views of a semiconductor device in accordance with a second embodiment of the inventive concept.
Figure 4:
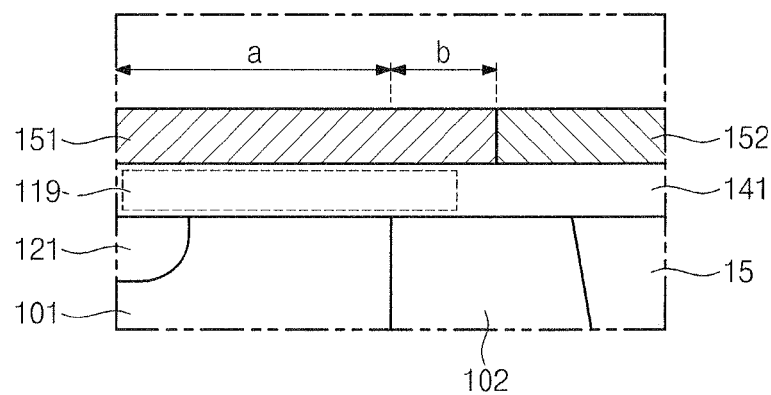
Figure 5:
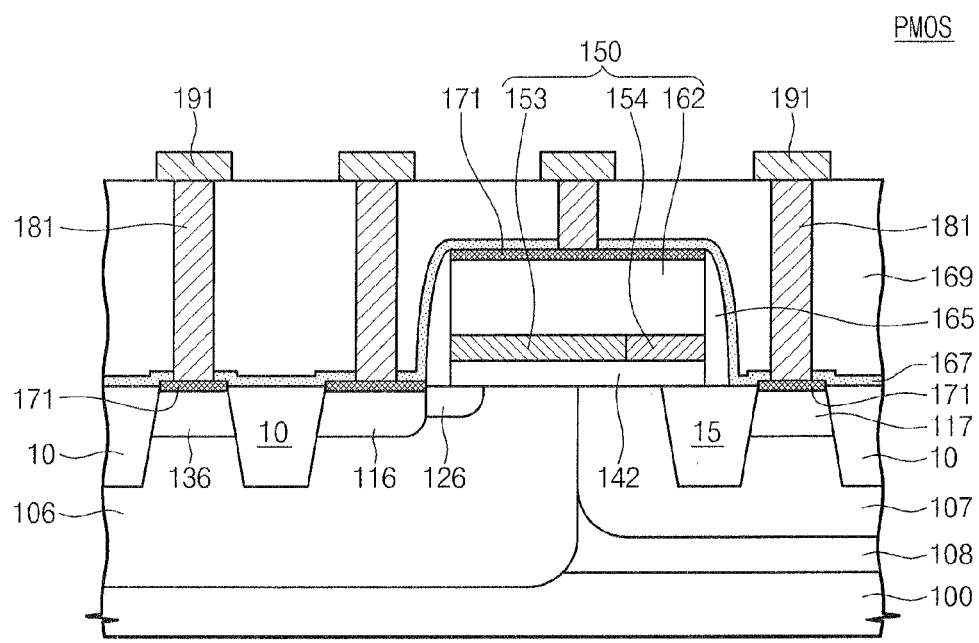

FIGS. 3 through 5 are cross sectional views of a semiconductor device in accordance with another embodiment of the inventive concept. Again, for brevity, the description of common structures will be omitted.

An NMOS transistor in accordance with this embodiment of the inventive concept is provided in FIG. 3. An isolation insulating film 15 may be disposed in a drift region 102 between a drain region 112 and a first well region 101. In the drift region 102, the isolation insulating film 15 may provide a detour for current flowing from the drain region 112 to a source region 111. As a result, any hot carrier effect is reduced and as a consequence the distance between the drain region 112 and a gate insulating film 141 may be shorter than that of the embodiment shown in FIG. 1. The bottom surface of the isolation insulating film 15 may be above the level of the bottom surface of the drift region 102.

A first gate portion 151 and a second gate portion 152 may be disposed on the gate insulating film 141. The first gate portion 151 may have a work function that is lower than that of the second gate portion 152.

FIG. 4 is an enlarged view of the gate insulating film 141 and a gate electrode structure. A third impurity region 119 may be disposed in the gate insulating film 141. The third impurity region 119 may include lanthanum (La). The lanthanum (La) in the third impurity region 119 may diffuse into the first gate portion 151 disposed thereon. The "a" region is a part of the first gate portion 151 that overlaps the first well region 101 and the "b" region is a part of the first gate portion 151 that overlaps the drift region 102. That is, in this embodiment, a part of the first gate portion 151 may extend on the drift region 102. As described above, the "a" region that is disposed onto the first well region 101 and have a low work function that may lower the threshold voltage of an NMOS transistor.

The "b" region disposed on the drift region 102 doped with an n-type impurity may improve the switching speed of a transistor. That is, when the first gate portion 151 having a relatively low work function is disposed on the n-type drift region 102, the surface Fermi level of the drift region 102 overlapping the first gate portion 151 relatively moves toward the conduction band and therefore the distance between the surface Fermi level and the conduction band may be reduced. Thus, a resistance of the drift region 102 may be lowered, thereby improving the switching speed of the transistor.

As described above, the second gate portion 152 having a relatively high work function may relieve any hot carrier effect. The switching speed improvement by the "b" region of the first gate portion 151 and relief of the hot carrier effect by the second gate portion 152 are in a tradeoff relation, i.e. improvement in one property tends to cause deterioration in the other property. Thus, performance of a transistor suitable for a working voltage may be obtained by adjusting an interface between the first gate portion 151 and the second gate portion 152.

FIG. 5 provides a PMOS transistor in accordance with the second embodiment of the inventive concept. For brevity the description of structures in common with FIG. 3 will not be repeated. A deep well 108 may be disposed under the drift region 107. The deep well 108 may contain a region doped with an n-type impurity. A doping concentration of the region in the deep well 108 may be similar to the doping concentration of the first well region 106. The deep well 108 may prevent a current provided through the drain region 117 from flowing to the substrate 100.

A first gate portion 153 and a second gate portion 154 may be disposed on a gate insulating film 142. The first gate portion 153 may have a work function relatively higher than the second gate portion 154. The first gate portion 153 may extend onto the drift region 107. That is, an interface between the first gate portion 153 and the second gate portion 154 may be disposed on the drift region 107. As described with reference to FIG. 4, a part of the first gate portion 153 that overlaps the drift region 107 doped with a p-type impurity may have a relatively high work function. The surface Fermi level of the drift region 107 relatively moves toward the conduction band and thereby the distance between the surface Fermi level and the conduction band may be reduced. Thus, the resistance of the drift region 107 may be lowered, thereby improving the switching speed of the transistor.

As described above, the second gate portion 154 having a relatively low work function may relieve any hot carrier effect. The switching speed improvement by the first gate portion 153 and a relief of hot carrier effect by the second gate portion 154 are in a tradeoff relation. Thus, performance of a transistor suitable for a working voltage may be obtained by adjusting the interface between the first gate portion 153 and the second gate portion 154.

Figure 6:
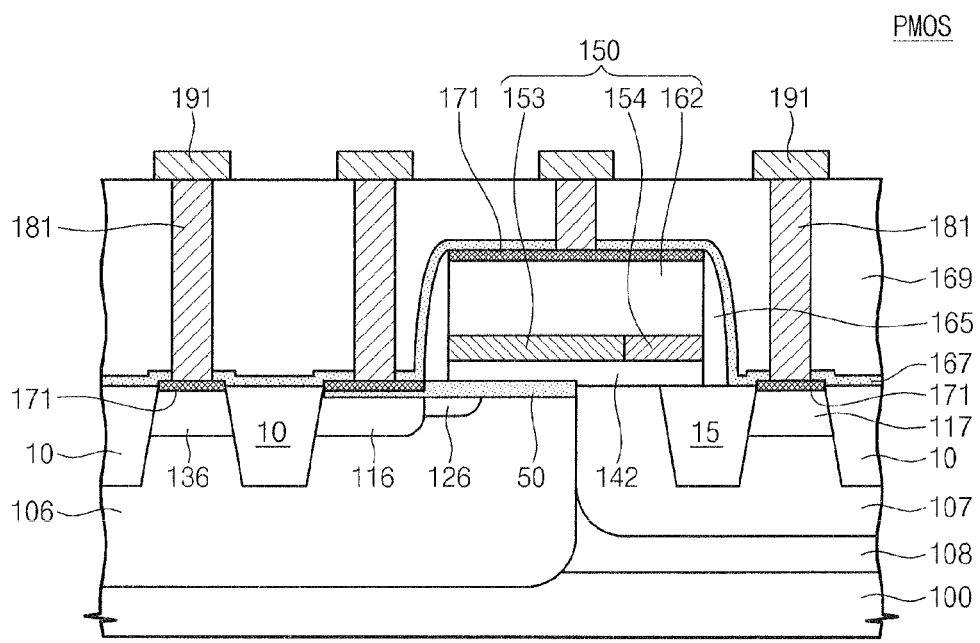
FIG. 6 is a cross sectional view of a semiconductor device in accordance with a third embodiment of the inventive concept.

Referring to FIG. 6, a PMOS transistor in accordance with another embodiment of the inventive concept is provided. The PMOS transistor is similar to the embodiment of FIG. 5 except for the addition of a silicon-germanium layer 50. A silicon-germanium layer 50 may be disposed between the first well region 106 and the gate insulating film 142. The silicon-germanium layer 50 may extend onto the source region 116 and the first extension region 126. At least of a part of the silicon-germanium layer 50 may be used as a channel region of the transistor. The band gap of the silicon-germanium layer 50 is smaller than that for silicon. Thus, the threshold voltage Vt may be lowered. Since carrier mobility of the silicon-germanium layer 50 is higher than silicon, the channel resistance may be relatively lowered compared with the case when silicon is used as a channel. Also, when forming the silicon-germanium layer 50 in a silicon substrate, strain may occur in the silicon-germanium layer 50 and this strain enhances mobility of carriers in the silicon-germanium layer 50. Thus, the switching speed of transistor is increased.

As an illustration, the silicon-germanium layer 50 may leave at least a part of a drift region 107 exposed. In this case when the silicon-germanium layer 50 exposes at least a part of the drift region 107, the switching speed of transistor may be improved while maintaining relief of hot carrier effects of the drift region 107.

Figure 7:
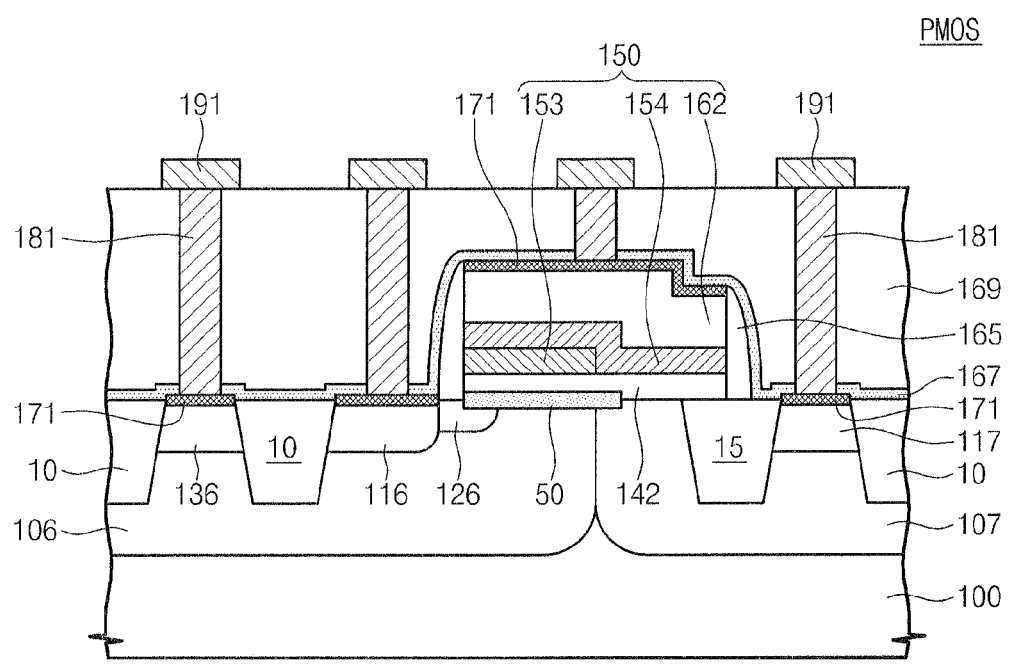
FIG. 7 is a cross sectional view of a semiconductor device in accordance with a modified example of the third embodiment of the inventive concept.

FIG. 7 is a cross sectional view of a semiconductor device in accordance with a modified example of the third embodiment of the inventive concept. For brevity of description, only a PMOS transistor is illustrated, but the same application is possible for an NMOS transistor. Referring to FIG. 7, a part of second gate portion 154 may be disposed on a first gate portion 153. Since the effect due to a work function difference is determined by the work function of the gate electrode part adjacent to the gate insulating film 142, the effect may be maintained even in a shape such that a part of gate portion overlaps the other portion as illustrated. Thus, shapes of the first and second gate portions 153 and 154 may be variously adjusted to achieve a suitable combination of first and second gate portions with different work functions.

In another modification of this embodiment, the silicon-germanium layer 50 may be disposed only under the gate insulating film 142. In still another modification of this embodiment, the silicon-germanium layer 50 may extend onto a part of the drift region 107.

A Manufacturing Method

Referring to FIGS. 8 through 13, manufacturing methods of certain illustrative embodiments of the inventive concept are provided. For brevity of description, an NMOS transistor is described, but a PMOS transistor may also be manufactured using a similar method.

Figure 8:
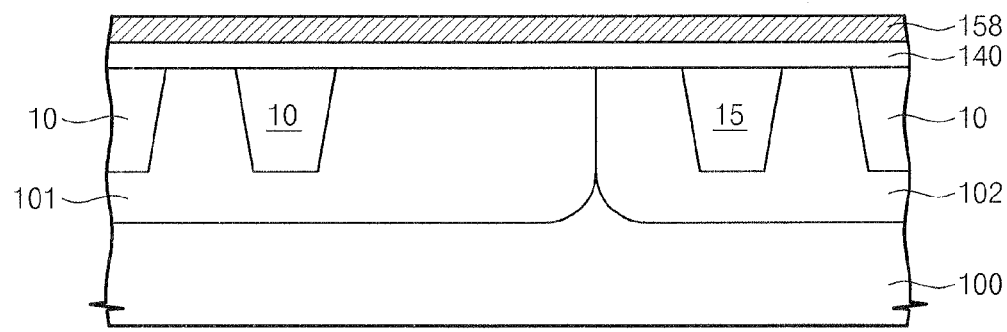
FIGS. 8 through 13 are cross sectional views of stages of manufacture of a semiconductor device in accordance with certain embodiments according to methods of the inventive concept.

Referring to FIG. 8, a plurality of impurity regions may be formed in a substrate 100. The substrate 100 may include any semiconductor based structure having a silicon surface. The semiconductor based structure may include a silicon, an epitaxial layer supported by a semiconductor structure, or a silicon on insulator. As an illustration, the substrate 100 may be a silicon substrate doped with a p-type impurity. A device isolation pattern 10 may be formed in the substrate 100. The device isolation pattern 10 may be a trench type device isolation pattern. As an illustration, the device isolation pattern 10 may include a silicon oxide film or a silicon oxynitride film. The device isolation pattern 10 may be formed taking into account the locations of a source region, a drain region and a well contact region (described below). An isolation insulating film 15 may be formed in the substrate 100, or in a first well region 101 of the substrate. The isolation insulating film 15 may be formed in a space of the substrate where a drift region 102 is to be formed.

The isolation insulating film 15 may include a silicon oxide film or a silicon oxynitride film. The isolation insulating film 15 may be formed concurrently with the device isolation pattern 10.

A first well region 101 may be formed in the substrate 100. The first well region 101 may be a region weakly doped with a p-type impurity. A drift region 102 may be formed to be adjacent to the first well region 101. The drift region 102 may be a region weakly doped with an n-type impurity. The first well region 101 and the drift region 102 may be formed by masks (not shown) using a positive photoresist or a negative photoresist respectively and using the same reticle.

A first insulating layer 140 and a first conductive layer 158 may be sequentially formed on the substrate 100. The first insulating layer 140 may include a high-k dielectric film having a dielectric constant higher than that of a silicon oxide film. As an illustration, the first insulating layer 140 may include one or more of a metal oxide film such as an aluminum oxide film, a hafnium oxide film and a metal-semiconductor-oxygen compound film such as a hafnium-silicon-oxygen-nitrogen compound film. The first insulating layer 140 may include a plurality of layers; for instance. the first insulating layer 140 may be provided in a form such that a hafnium oxide film and an aluminum oxide film are stacked. The first conductive layer 158 may include at least one of TiN, TaC, TaN, TaSiN, NiSi, Pt and TaCN. A relatively low work function of the first conductive layer 158 may be obtained by any one of a variety of methods. As an illustration, and without limitation, the first conductive layer 158 may further include at least one of Tb, Er, Yb or Sc. In another example of this embodiment, when the first conductive layer 158 is deposited at a lower temperature than the temperature at which a second conductive layer is deposited (as described below), the first conductive layer 158 may have a lower work function than that of the second conductive layer.

Figure 9:
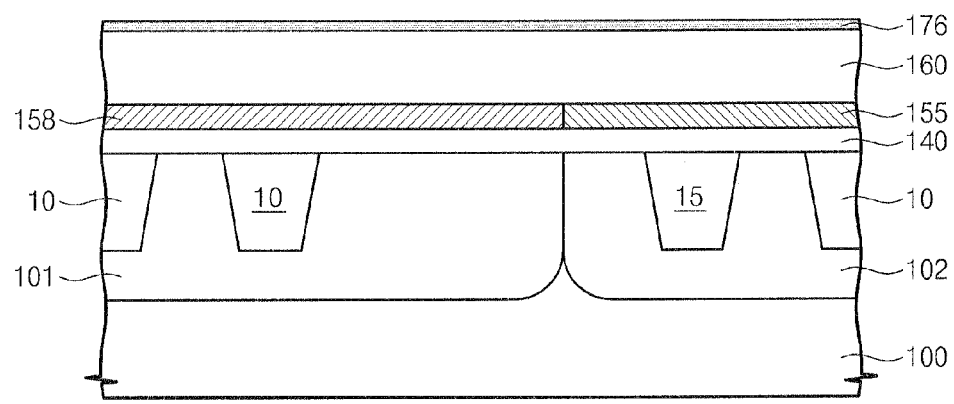

Referring to FIG. 9, a part of the first conductive layer 158 may be substituted for a second conductive layer 155. The second conductive layer 155 may be formed on the drift region 102. As an illustration, an interface between the second conductive layer 155 and the first conductive layer 158 may coincide with an interface between the first well region 101 and the drift region 102 but is not limited thereto and may be changed in various forms. The second conductive layer 155 may be formed of a material including one or more of TiN, TaC, TaN, TaSiN, NiSi, Pt and TaCN.

As an illustration, a part of the first conductive layer 158 may be removed and a second conductive layer 155 may be formed to replace the first conductive layer 158 that was removed. A work function of the second conductive layer 155 may be relatively higher than that of the first conductive layer 158. The relatively higher work function of the second conductive layer 155 may be obtained by various methods. As an illustration, the second conductive layer 155 may further include one or more of Pt, Ni and Ir. In another embodiment, the second conductive layer 155 is deposited at a higher temperature as compared with the temperature at which the first conductive layer 158 was deposited, whereby the second conductive layer 155 may have a high work function. In still another embodiment, the work function of the second conductive layer 155 may increased by further adding aluminum (Al) to the second conductive layer 155. As an illustration, the second conductive layer 155 may be formed by depositing aluminum on a TiN layer and then performing a high temperature diffusion process.

A first semiconductor layer 160 may be formed on the first and second conductive layers 158 and 155. As an illustration, the first semiconductor layer 160 may include polysilicon. A thickness of the first semiconductor layer 160 may be relatively greater than those of the first and second conductive layers 158 and 155. A capping film 176 may be formed on the first semiconductor layer 160. As an illustration, the capping film 176 may include a silicon nitride film.

Figure 10:
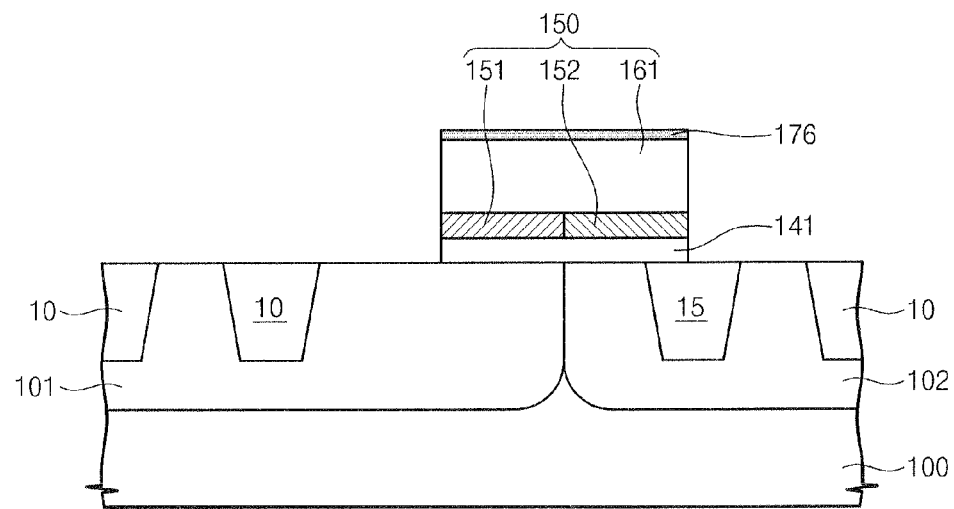

Referring to FIG. 10, a patterning process may be performed on a resultant structure in which the capping film 176 is formed to provide a gate insulating film 141 and a gate electrode structure 150. The gate electrode structure 150 may include first, second and third gate portions 151, 152 and 161. When performing the patterning process, the capping film 176 may also be patterned. The patterning process may be performed so that parts of the gate insulating film 141 and the gate electrode structure 150 cover a part of the isolation insulating film 15.

Figure 11:
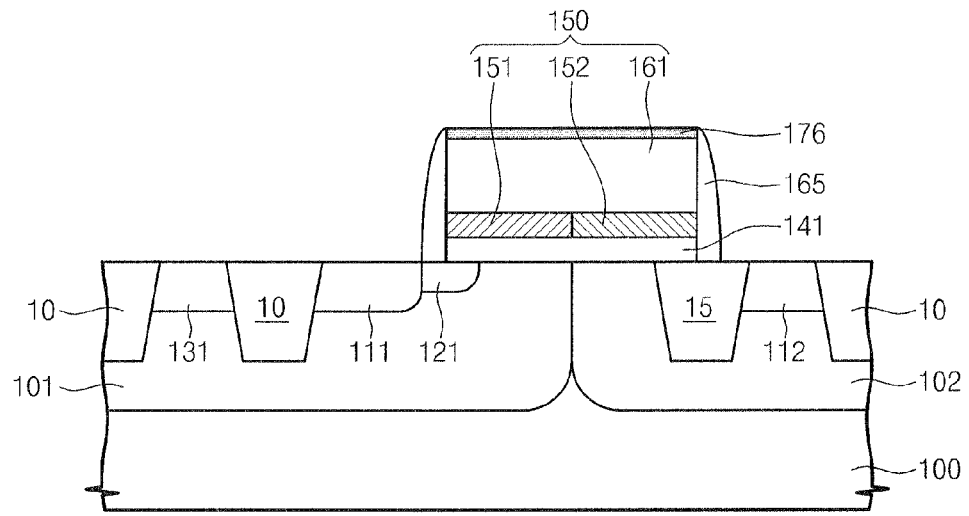

Referring to FIG. 11, a source region 111, a drain region 112 and a first extension region 121 may be formed in the substrate 100. After the first extension region 121, which may be weakly doped with an n-type impurity is formed, a spacer 165 may be formed on the sidewall of the gate electrode structure 150. After the spacer 165 is formed, the source and drain regions 111 and 112, which may be strongly doped with an n-type impurity may be added. A well contact region 131 strongly doped with a p-type impurity may also be added. The well contact region 131 is spaced apart from the source region 111 by the device isolation pattern 10. When impurity regions having a different conductivity type are deposited, unwanted doping of other regions may be prevented by covering a part of the substrate 100 using a mask (not shown).

Figure 12:
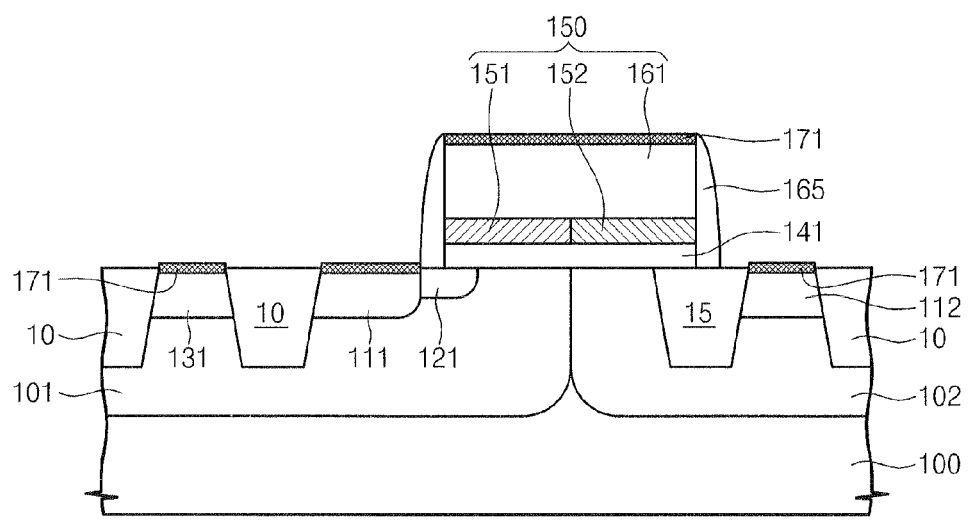

Referring to FIG. 12, the capping film 176 shown in FIG. 11 may be removed. A removal of the capping film 176 may be performed by a selective etching process. After the capping film 176 is removed, a silicide layer 171 may be formed on the exposed third gate portion 161, the source and drain regions 111 and 112, and the well contact region 131. As an illustration, the silicide layer 171 may be formed by a thermal process after forming a metal layer (not shown) covering the substrate 100 and the third gate portion 161.

Figure 13:
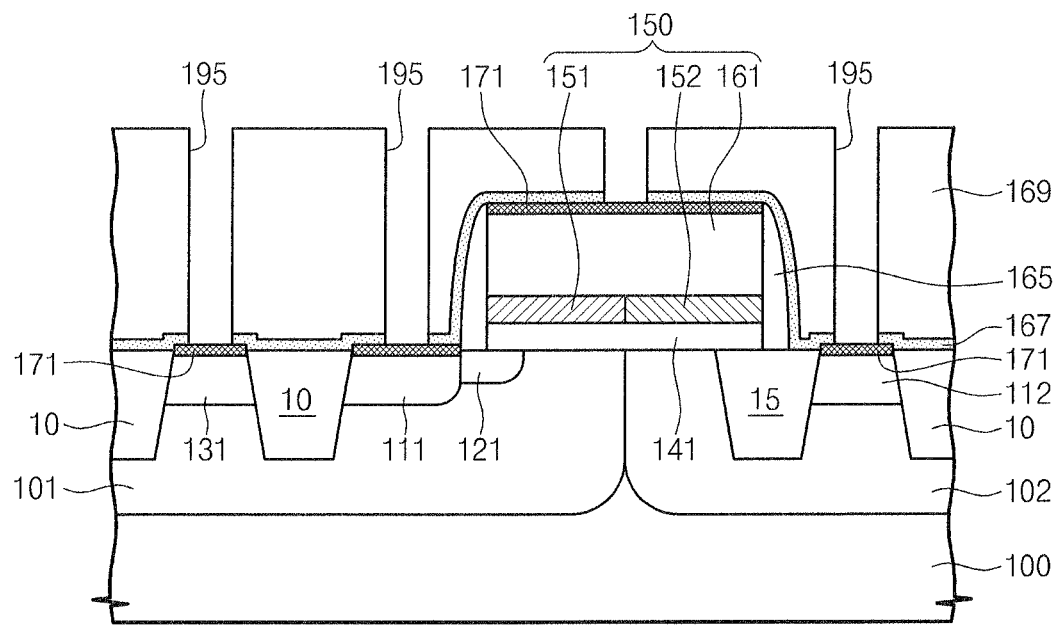

Referring to FIG. 13, an interlayer insulating film 169 may be formed on the resultant structure in which the silicide layer 171 is formed. The interlayer insulating film 169 may include a silicon oxide or a silicon oxynitride. The interlayer insulating film 169 may include contact holes 195 exposing the silicide layer 171. Optionally, an etch-stop film 167 may be formed before forming the interlayer insulating film 169. As an illustration, the etch-stop film 167 may be a silicon nitride film. The etch-stop film 167 may prevent a damage of the silicide layer 171 when forming the contact holes 195.

Referring back to FIG. 3, contact plugs 181 and conductive lines 191 electrically connected to the source and drain regions 111 and 112, the well contact region 131 and the gate electrode structure 150 may be formed. As an illustration, the conductive lines 191 and the contact plugs 181 may be formed of a metal or a conductive metal nitride.

Figure 14:
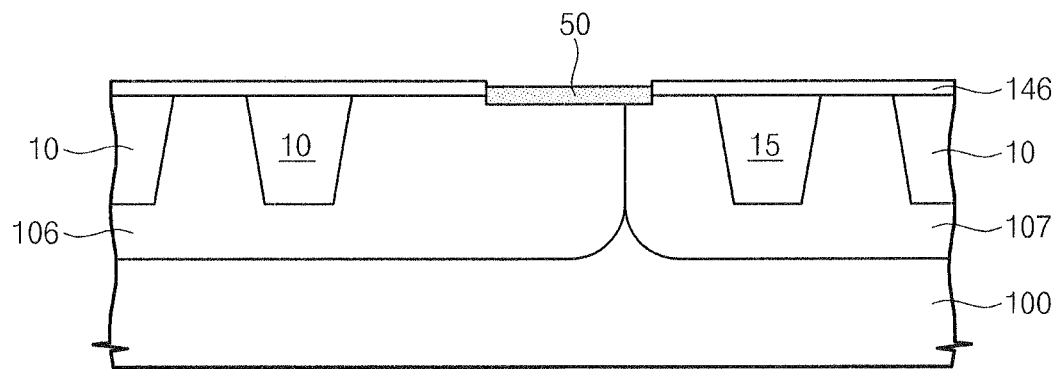
FIGS. 14 through 16 are cross sectional views stages of manufacture of a semiconductor device in accordance with certain other embodiments according to methods of the inventive concept.
Figure 15:
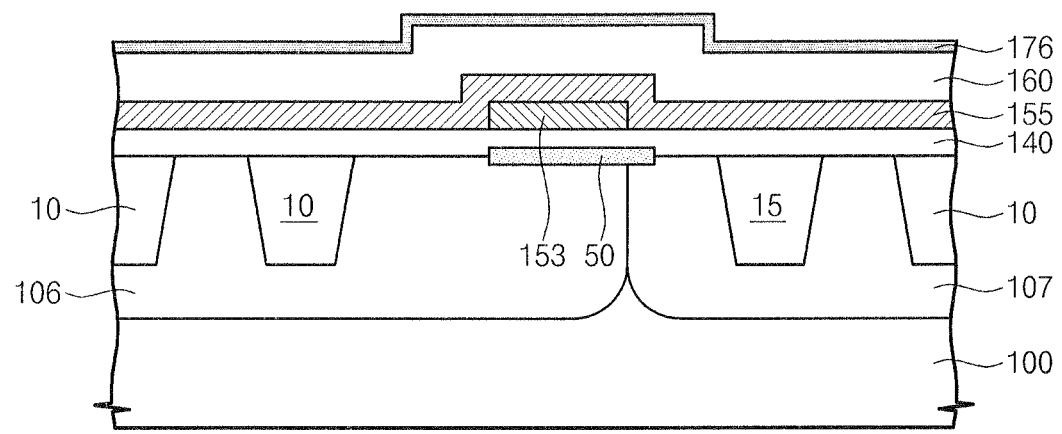
Figure 16:
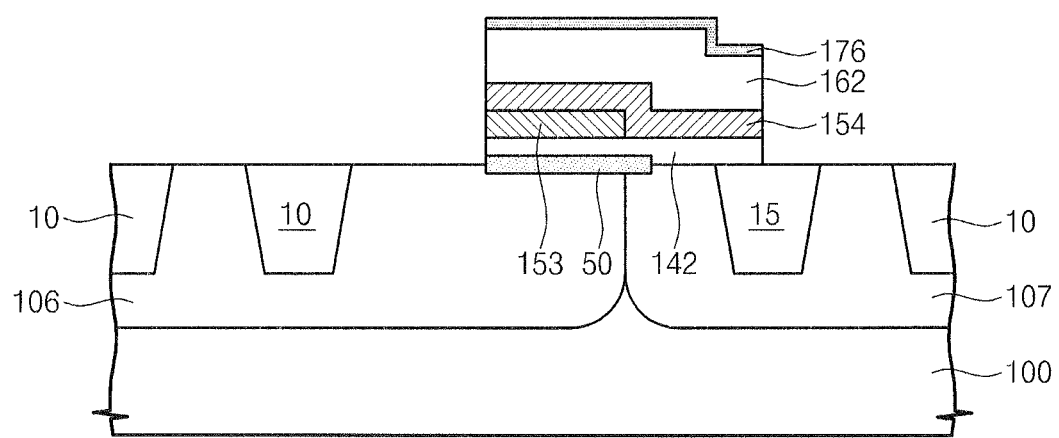

Referring to FIGS. 14 through 16, a manufacturing method for production of a PMOS transistor in accordance with certain alternative embodiments of the inventive concept is provided. For brevity of description, the description of common structures and processes described with reference to FIG. 13 will be omitted.

Referring to FIG. 14, a device isolation pattern 10 and an isolation insulating film 15 may be formed in a substrate 100. A first well region 106 may be disposed in the substrate 100. The first well region 106 may be a region weakly doped with an n-type impurity. A drift region 107 may be disposed in the substrate 100 so as to be adjacent to the first well region 106. The drift region 107 may be a region weakly doped with a p-type impurity.

A mask film 146 may be formed on the substrate 100 leaving a part of the substrate exposed. The mask film 146 may be formed so as to leave exposed an interface between the first well region 106 and the drift region 107. A silicon-germanium layer 50 may be formed on the substrate 100 exposed by the mask film 146. The method of forming the silicon-germanium layer 50 may include a selective epitaxial growth process. As an illustration, after forming a recess region (not shown) in the substrate 100 exposed by the mask film 146, the silicon-germanium layer 50 may be formed in the recess region. The silicon-germanium layer 50 may also be formed by a selective epitaxial growth process.

Referring to FIG. 15, after the silicon-germanium layer 50 is formed, the mask film 146 may be removed. A first insulating layer 140, a first gate portion 153, a second conductive layer 155, a third gate portion 160 and a capping film 176 may sequentially formed on the resultant structure in which the silicon-germanium layer 50 is formed. The first gate portion 153 may be formed on the first insulating layer 140 to cover at least a part of the silicon-germanium layer 50. The first gate portion 153 and the second conductive layer 155 may be formed of material including one or more of TiN, TaC, TaN, TaSiN, NiSi, Pt and TaCN. The first gate portion 153 may be formed to have a work function higher than that of the second conductive layer 155. As an illustration, a formation temperature of the first gate portion 153 may be chosen to be higher than the formation temperature of the second conductive layer 155. In another embodiment, the first gate portion 153 may include aluminum, thereby providing a relatively high work function. As an illustration, formation of the first gate portion may include a deposition of aluminum layer (not shown) on the first gate portion 153 and a thermal diffusion process. In still another embodiment, the first gate portion 153 may further include one or more of Pt, Ni and Ir, and the second conductive layer 155 may further include one or more of Tb, Er and Sc.

The first insulating layer 140 may include a high-k dielectric film having a dielectric constant higher than that of a silicon oxide film. The third gate portion 160 may be formed of a material including polysilicon. The capping film 176 may include a silicon nitride film or a silicon oxynitride film, or both.

Referring to FIG. 16, a patterning process is performed on a resultant structure in which the capping film 176 is formed to provide a gate insulating film 142 and first, second and third gate portions 153, 154 and 162. When the patterning process is performed, the capping film 176 may also be patterned. The patterning process may be performed so that the gate insulating film 142 and the gate portions 154, 154 and 162 cover a part of the isolation insulating film 15. Following processes are similar to the processes described with reference to above as illustrated in FIGS. 12 and 13.

According to above-described embodiments of the inventive concept, hot carrier effects may be relieved and switching characteristic of the semiconductor device may be improved.

Although a limited number of exemplary embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A semiconductor device comprising:
a source region and a drain region disposed in a substrate;
a drift region disposed adjacent to the drain region;
a gate insulating film disposed on the substrate;
an impurity region disposed in the gate insulting film, wherein the impurity region overlaps the drift region; and
a gate electrode disposed on the gate insulating film,
wherein the gate electrode comprises a first gate portion adjacent to the source region, a second gate portion adjacent to the drain region, and a third gate portion on the first and the second gate portions, wherein a thickness of the third gate portion is greater than a thickness of the first and second gate portions,
wherein the first gate portion and second gate portion each have different work functions,
wherein the first and second gate portions include a metal and the third gate portion includes a poly silicon.

2. The semiconductor device of claim 1, wherein the first gate portion is in direct contact with the second gate portion.

3. The semiconductor device of claim 1, wherein the substrate comprises:
a first well region having a first well region conductivity type and disposed adjacent to the source region, the source region having a source region conductivity type, the drift region having a drift region conductivity type, and the drain region having a drain region conductivity type,
wherein the first well region conductivity type is different from each of the source region conductivity type and the drain region conductivity type; and the drift region conductivity type is of the same conductivity type as each of the source region conductivity type and the drain region conductivity type.

4. The semiconductor device of claim 3, wherein the first well region conductivity type is a p-type, and wherein the drift region conductivity type, the source region conductivity type and the drain region conductivity type are each an n-type; and wherein the work function of the first gate portion is lower than the work function of the second gate portion.

5. The semiconductor device of claim 3, wherein the first well region conductivity type is an n-type, wherein the drift region conductivity type, the source region conductivity type and the drain region a conductivity type are each a p-type and wherein the first gate portion has a first work function and the second gate portion has a second work function; the first work function being higher than the second work function.

6. The semiconductor device of claim 5, further comprising a deep well under the drift region having a deep well conductivity type, wherein the deep well conductivity type is an n-type.

7. The semiconductor device of claim 3, wherein the drift region has a drift region doping impurity concentration and the drain region has a drain region doping impurity; and wherein the drift region doping impurity concentration is lower than the drain region doping impurity concentration.

8. The semiconductor device of claim 3, further comprising an isolation insulating film in the drift region between the drain region and the first well region.

9. The semiconductor device of claim 8, wherein the second gate portion extends onto the isolation insulating film.

10. The semiconductor device of claim 3, further comprising a silicon-germanium layer between the first well region and the gate insulating film,
wherein the silicon-germanium layer does not extend over at least a part of the drift region.

11. The semiconductor device of claim 1, wherein the first gate portion overlaps the first well region and the second gate portion overlaps the drift region.

12. The semiconductor device of claim 11, wherein the first gate portion extends onto the drift region.

13. The semiconductor device of claim 11, wherein the second gate portion extends onto the first gate portion.

14. The semiconductor device of claim 1, wherein the first and second gate portions each comprise one or more metal materials selected from the group consisting of TiN, TaC, TaN, TaSiN, NiSi, Pt and TaCN; and optionally further comprises one or more elements selected from the group consisting of Tb, Er, Yb and Sc.

15. The semiconductor device of claim 1, wherein the first gate portion comprises one or more metal materials selected from the group consisting of TiN, TaC, TaN, TaSiN, NiSi, Pt and TaCN; and optionally further comprises one or more elements selected from the group consisting of Tb, Er, Yb and Sc.

16. The semiconductor device of claim 1, wherein the second gate portion comprises one or more metal materials selected from the group consisting of TiN, TaC, TaN, TaSiN, NiSi, Pt and TaCN; and optionally further comprises one or more elements selected from the group consisting of Pt, Ni and Ir.

17. The semiconductor device of claim 1, wherein the gate insulating film comprises a metal oxide film selected from the group consisting of an aluminum oxide film, a hafnium oxide film, and a metal-semiconductor-oxygen compound film.

18. The semiconductor device of claim 17, wherein the metal-semiconductor-oxygen compound film is a hafnium-silicon-oxygen-nitrogen compound film.

19. The semiconductor device of claim. 1, further comprising a first well region disposed adjacent to the source region,
   wherein the gate insulating film comprises a first region overlapping the first well region, and a second region in a part of the gate insulating film overlapping the drift region,
   wherein the impurity region is included in the first region and the second region.

20. A semiconductor device comprising:
   a source region and a drain region disposed in a substrate;
   a drift region disposed adjacent to the drain region;
   a gate insulating film disposed on the substrate;
   an impurity region including lanthanum (La) disposed in the gate insulating film, wherein the impurity region overlaps the drift region; and
   a gate electrode disposed on the gate insulating film,
   wherein the gate electrode comprises a first gate portion adjacent to the source region and a second gate portion adjacent to the drain region, wherein the first gate portion overlaps the drift region, and
   wherein the first gate portion and second gate portion each have different work functions, and wherein the impurity region including lanthanum (La) is included in a first region of the gate insulating film contacting the first gate portion, and not included in a second region of the gate insulating film contacting the second gate portion.

21. The semiconductor device of claim 20, wherein the first gate portion includes lanthanum (La).

* * * * *